(12) United States Patent
Giallorenzi et al.

(10) Patent No.: US 7,529,524 B1
(45) Date of Patent: May 5, 2009

(54) ADAPTIVE POWER AMPLIFIER LINEARIZATION IN TIME DIVISION DUPLEX COMMUNICATION SYSTEMS

(75) Inventors: Thomas R. Giallorenzi, Riverton, UT (US); Michael Rice, Provo, UT (US); William K. McIntire, Sandy, UT (US); June Sun, Salt Lake City, UT (US)

(73) Assignee: L3 Communications Corporation, New York, NY (US)

( * ) Notice: Subject to any disclaimer, the term of this patent is extended or adjusted under 35 U.S.C. 154(b) by 526 days.

(21) Appl. No.: 11/259,850

(22) Filed: Oct. 26, 2005

(51) Int. Cl.
*H04B 1/04* (2006.01)
(52) U.S. Cl. ................. 455/126; 455/114.3; 455/194.2; 455/311; 375/295; 375/296; 375/297
(58) Field of Classification Search ................. 455/126, 455/114.3, 194.2, 311; 375/295, 296, 297
See application file for complete search history.

(56) References Cited

U.S. PATENT DOCUMENTS 5,832,022 A * 11/1998 Scott .......................... 375/142
2005/0105642 A1 * 5/2005 Muller et al. ............... 375/296

OTHER PUBLICATIONS

Y. Akaiwa and Y. Nagata, "Highly Efficient Digital Mobile Communications with a Linear Modulation Method", IEEE Journal on Selected Areas in Communications, vol. SAC-5, pp. 890-895, Jun. 1987.

A. Bateman, D. Haines, and R. Wilkinson, "Linear Transceiver Architectures", in Proc. Of the IEEE Vehicular Technology Conf. pp. 478-484, 1988.
S. Ono, N. Kondoh, and Y. Shimazaki, "Digital Cellular System with Linear Modulation", in Proc. Of the IEEE Vehicular Technology Conf., pp. 44-49, 1989.
M. Nannicini, P. Magni, and F. Oggioni, "Temperature Controlled Predistortion Circuits for 64 QAM Microwave Power Amplifiers", IEEE Microwave Theory Technical Digest, pp. 99-102, 1985.
J. Namiki, "An Automatically Controlled Predistoreter for Multilevel Quadrature Amplitude Modulation", IEEE Transactions on Communications, vol. COM-31, No. 5, pp. 707-712, May 1983.
A. Saleh and J. Salz, "Adaptive Linearization of Power Amplifiers in Digital Radio Systems", Bell Systems Technical Journal, vol. 62, No. 4, pp. 1019-1033, Apr. 1983.
H. Girard and K. Feher, A New Baseband Linearizer for More Efficient Utilization of Earth Station Amplifiers Used for QPSK Transmission, vol. SAC-1, No. 1, pp. 46-56, Jan. 1983.

(Continued)

*Primary Examiner*—Sanh D Phu
(74) *Attorney, Agent, or Firm*—Harrington & Smith, PC

(57) ABSTRACT

In an aspect of the invention, a method is performed in a transceiver for adaptive power amplifier linearization in time division duplex communication systems. The method comprises, in response to a first condition, performing, using a feedback signal generated by receiving subsystem circuitry, adaptive power amplifier linearization on a signal to be transmitted. The method additionally comprises, in response to a second condition, performing operations in order to determine receive data from a received radio frequency (RF) signal. The operations use at least the receiving subsystem circuitry. In a further aspect of the present invention, a transceiver is disclosed.

20 Claims, 4 Drawing Sheets

OTHER PUBLICATIONS

Y. Nagata, "Linear Amplification Technique for Digital Mobile Communications", in Proc. Of the IEEE Vehicular Technology Conference, pp. 159-164, 1989.

A. Katz, "Linearization: Reducing Distortion in Power Amplifiers", IEEE Microwave Magazine, pp. 37-49, Dec. 2001.

A. Behravan, T. Eriksson, A. Svensson and H. Zirath, Adaptive Predistorter Design for Nonlinear High Power Amplifiers, Proceedings of GHz 2003 Symposium, Linkoping, Sweden, conference paper.

K. Mekechuk, W. Kim, S. Stapleton and J. Kim, "Linearizing Power Amplifiers Using Digital Predistortion, EDA Tools and Test Hardware", High Frequency Electronics, Apr. 2004, pp. 18-30.

* cited by examiner

ADAPTIVE POWER AMPLIFIER LINEARIZATION IN TIME DIVISION DUPLEX COMMUNICATION SYSTEMS

TECHNICAL FIELD

This invention relates generally to radio frequency communication and, more specifically, relates to adaptive power amplifier linearization.

BACKGROUND OF THE INVENTION

Power amplifiers are used in certain communication systems to boost amplitude of a transmitted signal to allow reliable reception by a distant receiver. All power amplifiers exhibit some nonlinear characteristics, and the nonlinear characteristics may be described by quantifying properties of AM/AM and AM/PM curves for the power amplifier. An AM/AM curve represents input amplitude to output amplitude conversion, while the AM/PM curve represents input amplitude to output phase conversion. Nonlinearities caused by the nonlinear characteristics of power amplifiers distort the spectrum of the transmitted signal, causing the bandwidth of the output signal of the power amplifier to be wider than the bandwidth of the input signal of the power amplifier. Consequently, some form of compensation technique is required to produce a power efficient and bandwidth efficient communication system.

One of the compensation techniques used is power amplifier linearization. Power amplifier linearization uses predistortion to distort (e.g., the amplitude, phase or both) the input signal of the power amplifier so that, when combined with the amplifier characteristics, the concatenated input/output characteristic of both the predistortion and the power amplifier is linear. The power amplifier linearization can be either fixed or adaptive. Adaptive power amplifier linearization techniques are the most practical, since these techniques can adapt the predistortion to track changes in the characteristics of the power amplifier due to age, temperature, and other factors.

While there are benefits to adaptive power amplifier linearization, there are also problems associated therewith. It would therefore be desirable to provide techniques that overcome these problems.

BRIEF SUMMARY OF THE INVENTION

The foregoing and other problems are overcome, and other advantages are realized, in accordance with exemplary embodiments of these teachings. In particular, the present invention provides techniques for adaptive power amplifier linearization for time division duplex communication systems.

In an aspect of the invention, a method is performed in a transceiver for adaptive power amplifier linearization in time division duplex communication systems. The method comprises, in response to a first condition, performing, using a feedback signal generated by receiving subsystem circuitry, adaptive power amplifier linearization on a signal to be transmitted. The method additionally comprises, in response to a second condition, performing operations in order to determine receive data from a received radio frequency (RF) signal. The operations use at least the receiving subsystem circuitry.

In a further aspect of the present invention, a transceiver is disclosed that comprises first and second inputs and first and second outputs. The transceiver additionally comprises adaptive power amplifier linearization circuitry comprising first and second inputs and an output. The first input of the adaptive power amplifier linearization circuitry is coupled to the first input of the transceiver. The output of the adaptive power amplifier linearization circuitry is coupled to the first output of the transceiver. The transceiver also comprises a first switch comprising first and second input terminals and an output terminal. The first input terminal of the first switch is coupled to the output of the adaptive power amplifier linearization circuitry. The second input terminal of the first switch coupled to the second input of the transceiver.

The transceiver also comprises receiving subsystem circuitry having an input and an output. The input of the receiving subsystem circuitry is coupled to the output terminal of the first switch. The transceiver additionally has a second switch comprising first and second output terminals and an input terminal. The input terminal of the second switch is coupled to the output of the receiving subsystem circuitry. The first output terminal of the second switch is coupled to the second input of the adaptive power amplifier predistortion algorithm circuitry. The second output terminal of the second switch is coupled to the second output of the transceiver.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein.

DETAILED DESCRIPTION OF EXEMPLARY EMBODIMENTS

Figure 1:
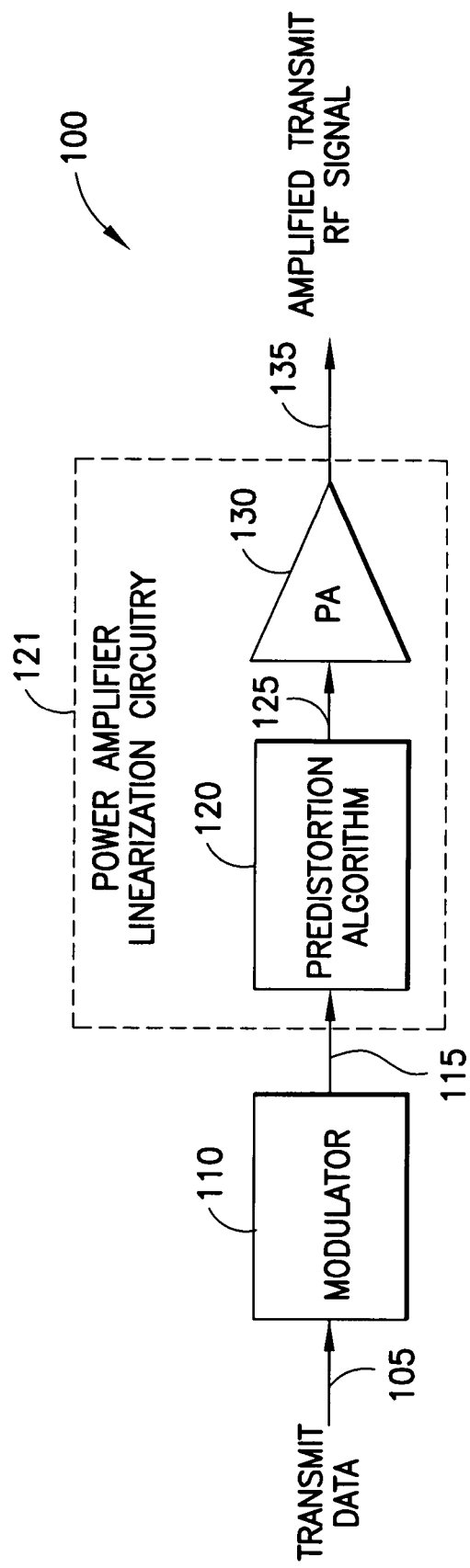
FIG. 1 is a block diagram of an exemplary transmitter used to illustrate power amplifier linearization.

As previously described, power amplifier linearization is one technique used to reduce the effects of nonlinear characteristics of power amplifiers. Shown in FIG. 1 is a transmitter 100 that comprises a modulator 110 coupled to power amplifier linearization circuitry 121. The power amplifier linearization circuitry 121 comprises predistortion algorithm circuitry 120 and a power amplifier 130. The modulator 110 modulates transmit data 105 through techniques such as linear pulse shaped modulation. The modulator 110 produces a modulated data signal 115, which is coupled to the predistortion algorithm circuitry 120. It is to be noted that signals are coupled though circuitry such as traces on a circuit board or wiring levels on a semiconductor. A signal is therefore typically considered to be separate from the circuitry on which the signal is placed. For clarity, however, signals will mainly be described herein without regard to the circuitry on which the signal resides.

The predistortion algorithm circuitry 120 distorts the modulated data signal 115 to create a distorted data signal 125 that is coupled to the power amplifier 130. The power amplifier 130 produces an amplified transmit radio frequency (RF) signal 135. The distortion caused by the predistortion algorithm circuitry 120 occurs so that, when the distorted signal 125 is combined with characteristics of the power amplifier 130, the input/output characteristic of the power amplifier linearization circuitry 121 is approximately linear. In other words, there is an approximately linear relationship between the transmit signal 135 and the modulated data signal 115.

Power amplifier linearization techniques performed by the power amplifier linearization circuitry 121 can be either fixed or adaptive. As stated above, adaptive linearization techniques are the most practical, since these techniques can adapt distortion caused by the predistortion algorithm circuitry 120 in order to track changes in characteristics of the power amplifier 130 due to age, temperature, and other factors.

Figure 2:
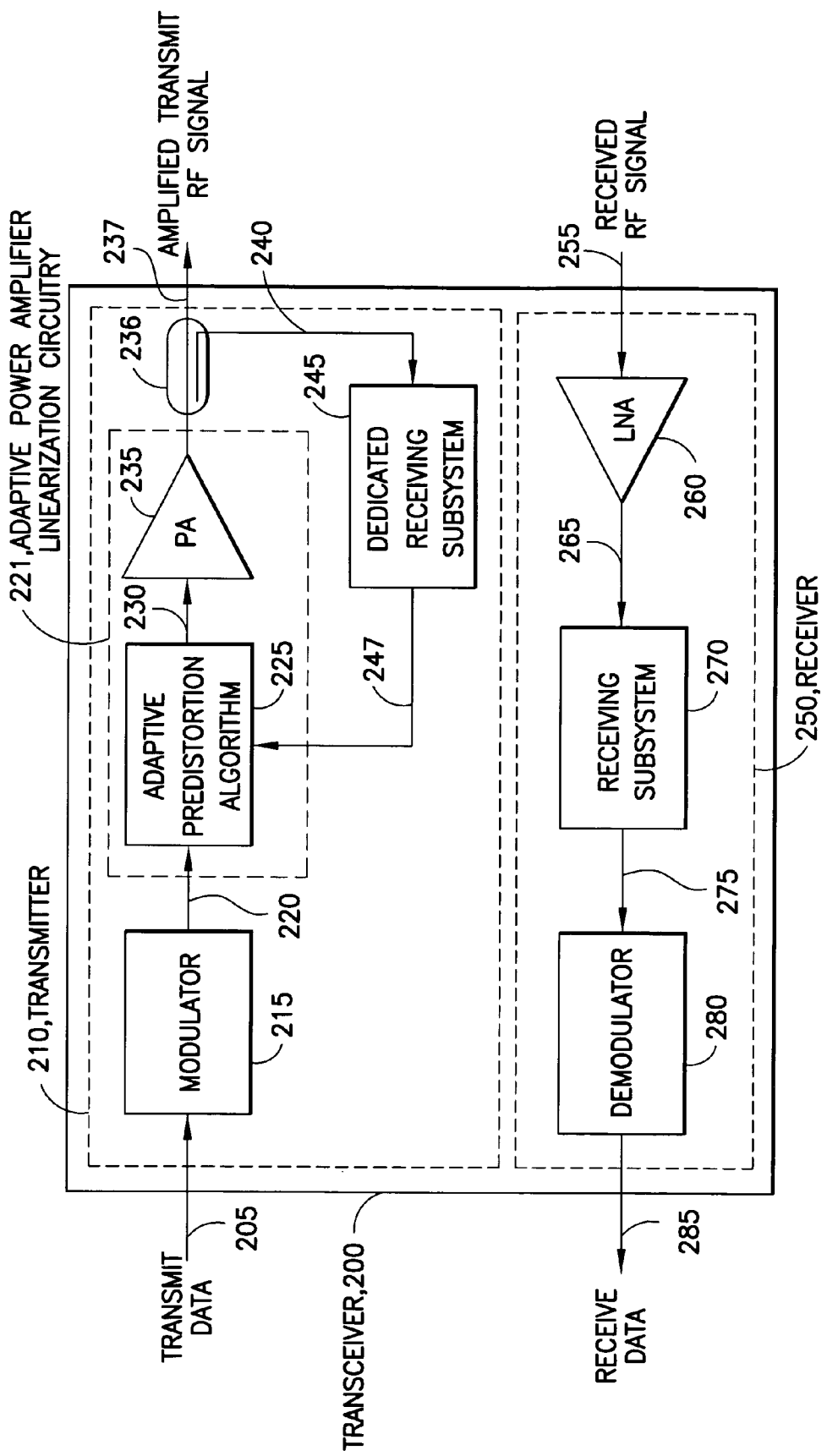
FIG. 2 is a block diagram of an exemplary transceiver used to illustrate adaptive power amplifier linearization.

Turning now to FIG. 2, an exemplary transceiver 200 is shown that is used to illustrate adaptive power amplifier linearization. Transceiver 200 comprises a transmitter 210 and a receiver 250. Transmitter 210 comprises a modulator 215, adaptive power amplifier linearization circuitry 221, a tap 236, and dedicated receiving subsystem circuitry 245. The adaptive power amplifier linearization circuitry 221 comprises adaptive predistortion algorithm circuitry 225 and a power amplifier 235. The receiver 250 comprises a low noise amplifier (LNA) 260, receiving subsystem circuitry 270, and a demodulator 280.

The modulator 215 modulates transmit data 205 through techniques such as linear pulse shaped modulation. The modulator 215 produces a modulated data signal 220, which is coupled to the adaptive predistortion algorithm circuitry 225.

The adaptive predistortion algorithm circuitry 225 distorts the modulated data signal 220 to create a distorted data signal 230 that is coupled to the power amplifier 235. The power amplifier 235 produces an amplified transmit RF signal 237, which is suitable for coupling to one or more antennas (not shown). The input/output characteristic of the adaptive power amplifier linearization circuitry 221 is approximately linear. The dedicated receiving subsystem circuitry 245 is coupled to the amplified transmit RF signal 237 through tap 236. Typically, a tap 236 will reduce the power of the amplified transmit RF signal 237 to produce a reduced power transmit RF signal 240. However, the dedicated receiving subsystem circuitry 245 can also reduce the power of the amplified transmit RF signal 237, if necessary. The dedicated receiving subsystem circuitry 245 operates on the reduced power transmit RF signal 240 and creates a feedback signal 247. The adaptive predistortion algorithm circuitry 225 then compares the feedback signal 247 with the modulated data signal 220 (e.g., generally a delayed version of the modulated data signal 220) and updates characteristics of an adaptive predistortion algorithm portion (not shown) based on the comparison.

On the receiver 250, the LNA 260 amplifies the received RF signal 255 and creates an amplified received RF signal 265. The received RF signal 255 is received from one or more antennas (not shown). The receiving subsystem circuitry 270 operates on the amplified received RF signal 265 and produces a received signal 275. The received signal 275 is demodulated by demodulator 280 to produce receive data 285.

As FIG. 2 shows, an adaptive predistortion algorithm, implemented in the adaptive predistortion algorithm circuitry 225, must have some mechanism for monitoring the output (e.g., the amplified transmit RF signal 237) of the power amplifier 235. However, transceiver designs such as the one illustrated in FIG. 2 require a transmitter 210 with a dedicated receiving subsystem circuitry 245 to monitor the output of the power amplifier 235. The dedicated receiving subsystem circuitry 245 adds complexity and cost to the transceiver 200.

For communication systems where the transceiver 200 can transmit and receive at the same time (e.g., the adaptive amplifier linearization circuitry 221 performs power amplifier linearization on the modulated data signal 220 while the receiving subsystem circuitry 270 operates on or "listens" for the amplified received RF signal 265), then the dedicated receiving subsystem circuitry 245 is useful. However, in a time-division duplex (TDD) communication system, a transceiver would have an idle receiver when a corresponding transmitter is active. Typically, a TDD communication system would transmit for a period of time then receive (e.g., "listen") for a period of time, and transmission of data and reception of data are generally mutually exclusive. Such TDD communication systems include time-division multiplexing (TDM) systems and systems using a half-duplex link. In these communication systems, the transmitter 210 is typically active during the transmission of a data burst and typically inactive during a subsequent interval to allow reception of signals from other transmitters. During burst transmission, the receiving subsystem circuitry 270 is idle since the output of the power amplifier 235 during the burst swamps any other signal that may be present, thereby rendering reception unlikely or impossible. The idle receiving subsystem circuitry 270 can be used to monitor the power amplifier output (e.g., amplified transmit RF signal 237) for the purposes of adaptive power amplifier linearization as described above. Such a system is illustrated in FIG. 3.

Figure 3:
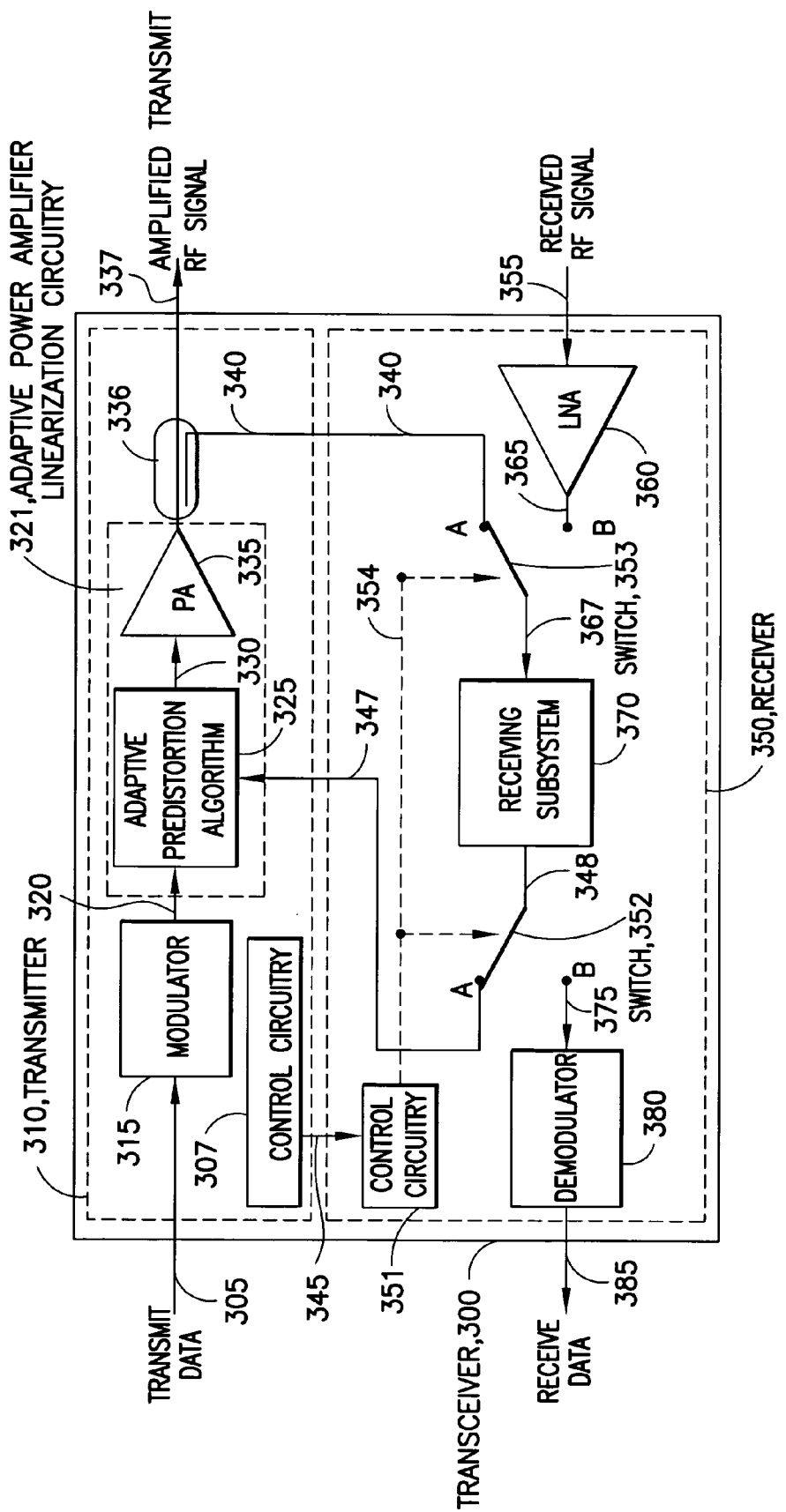
FIG. 3 is a block diagram of an exemplary transceiver using adaptive power amplifier linearization in accordance with an illustrative embodiment of the present invention.

Referring now to FIG. 3, an exemplary transceiver 300 is shown that is used to illustrate adaptive power amplifier linearization in accordance with an illustrative embodiment of the present invention. Transceiver 300 comprises a transmitter 310 and a receiver 350. Transmitter 310 comprises a modulator 315, adaptive amplifier linearization circuitry 321, a tap 336, and control circuitry 307. The adaptive amplifier linearization circuitry 321 comprises adaptive predistortion algorithm circuitry 325 and a power amplifier 335. The receiver 350 comprises a low noise amplifier (LNA) 360, receiving subsystem circuitry 370, a demodulator 380, switches 352 and 353, and control circuitry 351.

The modulator 315 comprises circuitry (not shown) that modulates transmit data 305 through known modulation techniques such as linear pulse shaped modulation. The modulator 315 produces a modulated data signal 320, which is coupled to the adaptive predistortion algorithm circuitry 325.

The adaptive predistortion algorithm circuitry 325 distorts the modulated data signal 320 to create a distorted data signal 330 that is coupled to the power amplifier 335. A reference describing that some form of compensation technique is required to produce a power efficient and bandwidth efficient system is A. Katz, "Linearization: Reducing Distortion in Power Amplifiers," IEEE Microwave Magazine, pp. 37-49, December 2001, the disclosure of which is hereby incorporated by reference. The power amplifier 335 produces an amplified transmit RF signal 337, which is suitable for coupling to one or more antennas (not shown). The input/output characteristic of the adaptive power amplifier linearization circuitry 321 is approximately linear.

In an exemplary embodiment, the switches 352 and 353 are switched to the A positions when the transmitter 310 is in an active state. When the switches 352 and 353 are switched to the A positions, signals are routed from the amplified transmit RF signal 337 to and through the receiving subsystem circuitry 370 and to the adaptive predistortion algorithm circuitry 325. Typically, a tap 236 will reduce the power of the amplified transmit RF signal 337 to produce a reduced power transmit RF signal 340 that is coupled to input A of the switch 353. However, the receiving subsystem circuitry 370 can also reduce the power of the amplified transmit RF signal 337, routed through output 367 of the switch 353, if desired. The receiving subsystem circuitry 370 operates on the reduced power transmit RF signal 340 and creates a feedback signal 347 that is coupled to the input 348 of the switch 352 to the adaptive predistortion algorithm circuitry 325.

The adaptive predistortion algorithm circuitry 325 then compares the feedback signal 347 with the modulated data signal 320 (e.g., generally a delayed version of the modulated data signal 320) and updates characteristics of an adaptive predistortion algorithm portion (not shown) of the adaptive predistortion algorithm circuitry 325 based on the comparison.

In an exemplary embodiment, when the transmitter 310 is idle, the switches 352 and 353 are switched to the B positions. In these positions, the LNA 260 amplifies the received RF signal 355 and creates an amplified received RF signal 365. The amplified received RF signal 365 is coupled to the receiving subsystem circuitry 370 through the output 367 of the switch 353. The receiving subsystem circuitry 370 can receive transmissions (e.g., burst transmissions) from other transmitters. The receiving subsystem circuitry 370 operates on the amplified received RF signal 365 and produces received signal 375 that is routed to the input 348 of the switch 352 to the demodulator 380. The received signal 375 is demodulated by demodulator 380 to produce receive data 385.

The approach shown in FIG. 3 has a "dual use" of the receiving subsystem circuitry 370. This dual use eliminates the need for a separate receiving subsystem circuitry (e.g., dedicated receiving subsystem circuitry 245 of FIG. 2) dedicated exclusively to monitoring the output (e.g., amplified transmit RF signal 337) of the power amplifier 335.

Switches 352 and 352 are controlled, e.g., in a coordinated fashion, by the control circuitry 351 through control signal 354. The switches can be any device suitable for coupling a signal from a first terminal to one of a plurality of second terminals. Thus, switches could be, illustratively, relays, two or more transistors, multiplexers, and some combination of two or more of these. In the example of FIG. 3, control circuitry 307 communicates a state of the transmitter 310 through a connection 345 to control circuitry 351. For instance, a zero on connection 351 could correspond to "active" and a one on connection 351 could correspond to "idle." In response to the state of the transmitter, the control circuitry 351 coordinates switching of the two switches 352 and 353 into appropriate positions A or B.

The control circuitries 307 and 308 may be combined into one circuit or could be further distributed into smaller circuitry. Additionally, it is not necessary for a "state" of a transmitter to be known. For instance, control circuitries 307 and 308 could be clock circuitry implemented to allow the transmitter 310 to transmit for a first time period (e.g., during which the switches 352 and 353 would be in position A) and to allow the receiver 350 to receive for a second time period (e.g., during which the switches 352 and 353 would each be in position B).

Furthermore, an active state of transmitter 310 typically means that the transmitter 310 is transmitting. However, the transmitter 310 may be preparing to transmit when the transmitter 310 is in an active state but the receiver 350 could be receiving transmissions from other transmitters when the transmitter 310 is in the active state but not transmitting. For simplicity, it is assumed herein that, in response to the transmitter being in the active state, the control circuitry 351 will switch each of the switches 352 and 353 to position A, and that, in response to the transmitter being in an idle state, the control circuitry 351 will switch each of the switches 352 and 352 to position B. It should be noted that the switches 352 and 353 need not be switched to position A for the entire period that the transmitter 310 is transmitting. However, it will typically be the case that the switches 352 and 353 are switched to position A for at least the entire period that the transmitter 310 is transmitting.

The transceiver 300 may be implemented in many different ways known to those skilled in the art, and the receiving subsystem circuitry 370, depending on the implementation of the transceiver 300, performs operations known to those skilled in the art to convert a signal on the output 367 of the switch 353 into the feedback signal 347 and the received signal 375. For instance, the modulator 315 could be a baseband modulator with linear pulse shaped modulation and the receiving subsystem circuitry 370 could comprise a matched filter (not shown) and a nonlinear equalizer (not shown).

As another example, the modulator 315 could be a baseband modulator and the adaptive power amplifier linearization circuitry 321 could comprise pulse shaping circuitry intermediate the adaptive predistortion algorithm circuitry 325 and the power amplifier 335. In the latter example, the receiving subsystem circuitry 370 could again comprise a matched filter and a nonlinear equalizer. See, for instance, an article by A. Behravan et al., entitled "Adaptive Predistorter Design for Nonlinear High Power Amplifiers," Proc. of GHz 2003 Symposium, Linköping, Sweden (November 2003), the disclosure of which is hereby incorporated by reference. Behravan describes non-adaptive power amplifier linearization, but without the dual use design of FIG. 3.

As yet another example, the adaptive power amplifier linearization circuitry 321 could comprise a digital-to-analog converter (DAC) (not shown) that is intermediate the adaptive predistortion algorithm circuitry 325 and the power amplifier 335. The modulator 315 could be moved into the adaptive power amplifier linearization circuitry 321, placed after the DAC, and adapted to perform up-conversion. The receiving subsystem circuitry 370 could then comprise the demodulator 380 (adapted also to perform down-conversion) and analog-to-digital conversion (ADC). The adaptive predistortion algorithm circuitry 325 could also comprise (not shown) an adaptation algorithm section, a look-up table section, a delay, and a complex gain adjustment section. The adaptation algorithm section compares the transmit data 305 (after passing through the delay) with the feedback signal 347 and modifies values in the lookup table section (which also has input from the transmit data 305). The complex gain adjustment section has input from the look-up table section and performs the distortion of the transmit data 305 to create the distorted data signal 330. See, for instance, K. Mekechuk et al., "Linearizing Power Amplifiers Using Digital Predistortion, EDA Tools and Test Hardware," High Frequency Electronics, pp. 18-24, April 2004, the disclosure of which is hereby incorporated by reference. Mekechuk describes non-adaptive power amplifier linearization, without the dual use design of FIG. 3, but the techniques in Mekechuk also have been applied to adaptive power amplifier linearization.

Additional examples of predistortion and associated communication systems are found in the following references, the disclosures of which is hereby incorporated by reference: (1) Y. Akawa and Y. Nagata, "Highly Efficient Digital Mobile Communications with a Linear Modulation Method," IEEE Journal on Selected Areas in Communication, vol. SAC-5, pp. 890-895, June 1987; (2) A. Bateman, D. Haines, and R. Wilkinson, "Linear Transceiver Architectures," in Proc. of the IEEE Vehicular Technology Conf., pp. 478-484, 1988; (3) S. Ono, N. Kondoh, and Y. Shimazaki, "Digital Cellular System With Linear Modulation," in Proc. of the IEEE Vehicular Technology Conf., pp. 44-49, 1989; (4) M. Nannicini, P. Magni, and F. Oggioni, "Temperature Controlled Predistortion Circuits for 64 QAM Microwave Power Amplifiers," IEEE Microwave Theory Technical Digest, pp. 99-102, 1985; (5) J. Hamiki, "An Automatically Controlled Predistorter for Multilevel Quadrature Amplitude Modulation," IEEE Transactions on Communications, vol. COM-31, pp. 707-712, May 1983; (6) H. Girard and K. Feher, "A New Baseband Linearizer for More Efficient Utilization of Earth Station Amplifiers Used for QPSK Transmission," IEEE Journal on Selected Areas in Communications, vol. SAC-1, pp. 46-56, January 1983; (7) J. Graboski and R. Davis, "An Experimental MQAM MODEM Using Amplifier Linearization and Baseband Equalization Techniques," in Proc. of the National Communications Conference, pp. E3.2.1-E3.2.6, 1982; (8) A. Saleh and J. Salz, "Adaptive Linearization of Power Amplifiers in Digital Radio Systems," Bell Systems Technical Journal, vol. 62, no. 4, pp. 1019-1033, April 1983; and (9) Y. Nagata, "Linear Amplification Technique for Digital Mobile Communications," in Proc. of the IEEE Vehicular Technology Conference, pp. 159-164, 1989.

The transmitter 310 and receiver 350 may comprise additional components known to those skilled in the art. For instance, coding circuitry (not shown) for block or convolutional coding may be added to the transmitter 310 and corresponding decoding circuitry (not shown) may be added to the receiver 350.

Furthermore, as used herein, the term "circuitry" can include one or more processors, such as digital signal processors (DSPs), that are programmed using instructions to perform the functions described herein. Such processors are typically coupled to one or more memories. Additionally, "circuitry" could comprise a combination of a processor and hardware elements, where the processor performs certain functions described herein and the hardware elements performs additional functions described herein. Such hardware elements could be discrete devices, integrated circuits, such as very large scale integrated (VLSI) circuits, gate arrays, or a combination of two or more of these. The circuitry may also include memory. As is known in the art, embodiments of the present invention may be provided as part of a signal bearing medium tangibly embodying a program of machine-readable instructions executable by a processor to perform one or more operations described herein.

Figure 4:
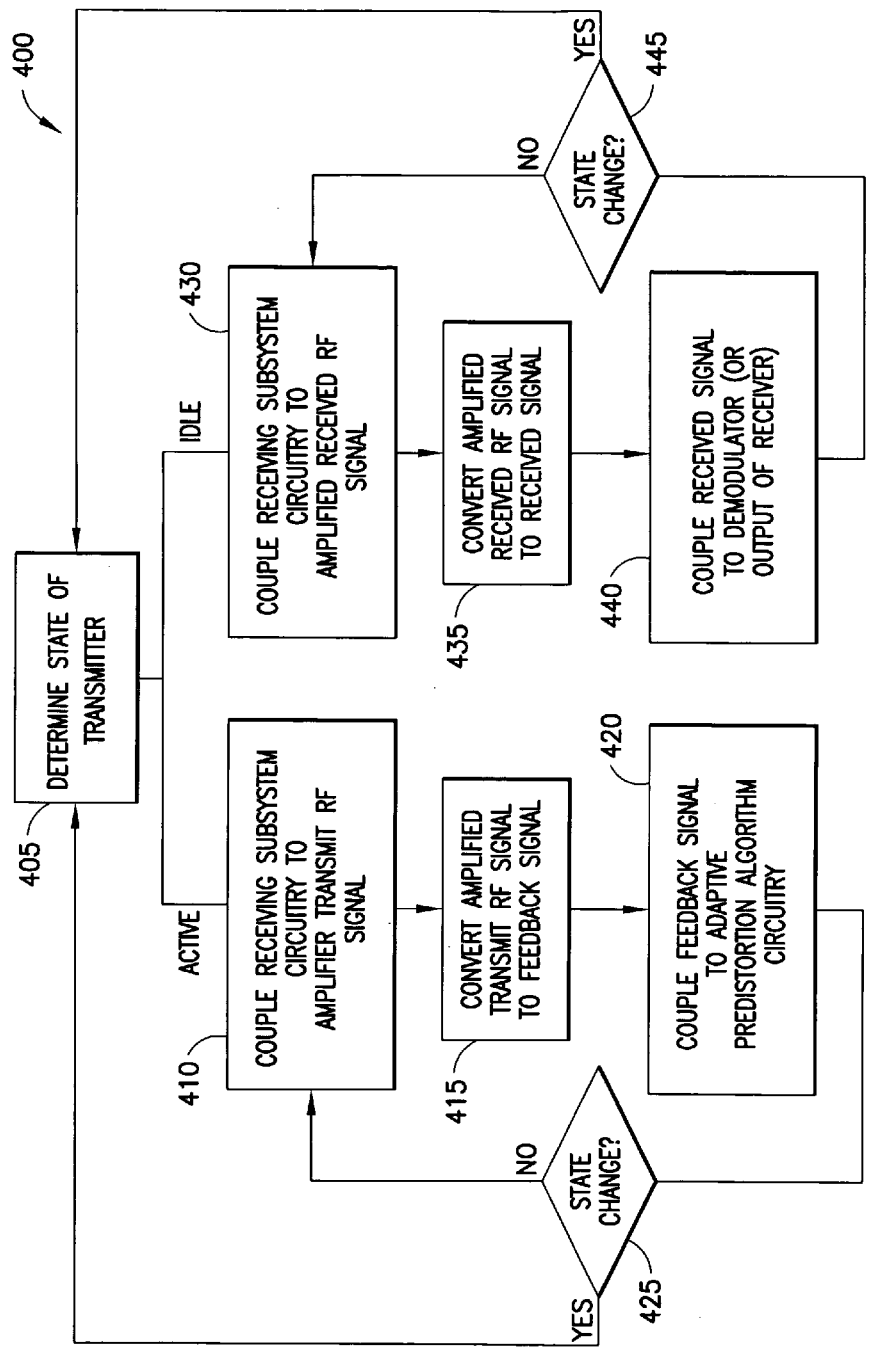
FIG. 4 is method performed by a receiver that allows adaptive power amplifier linearization in accordance with an exemplary embodiment of the present invention.

Turning now to FIG. 4 with appropriate reference to FIG. 3, a method 400 is shown that is performed by receiver 350 of FIG. 3 and that allows adaptive power amplifier linearization in accordance with an exemplary embodiment of the present invention. Method 400 begins in step 405 when the state of the transmitter 310 is determined. The state of the transmitter 310 may be determined, as described above, in an exemplary embodiment when connection 345 is sampled by control circuitry 351 of the receiver 350. If the state of the transmitter 310 is "Active," steps 410-425 are performed. In step 410, the receiving subsystem circuitry 370 is coupled (e.g., by the switch 353) to the amplified transmit RF signal 337. In step 415, the receiving subsystem circuitry 370 converts the reduced power RF transmit signal 340 to the feedback signal 347. In step 420, the feedback signal 347 is coupled to the adaptive predistortion algorithm circuitry 325 (e.g., through the switch 352). In step 425, if there is no state change (step 425=No), then steps 410 through 420 are performed again. Typically, the first time step 410 is performed, the switch 353 will be changed to position A, and the position of switch 353 will not change until a state change in step 425 (step 425=Yes). Similarly, the first time step 420 is performed, the switch 352 will be changed to position A, and the position of switch 352 will not change until state change in step 425 (step 425=Yes). When there is a state change (step 425=Yes), the method continues in step 405. Note that steps 410-425 can be considered to correspond to an idle state of the receiver 350.

If the state of the transmitter 310 is "Idle," steps 430-445 are performed. In step 430, the receiving subsystem circuitry 370 is coupled (e.g., by the switch 353) to the amplified received RF signal 365. In step 435, the receiving subsystem circuitry 370 converts the amplified received RF signal 365 to the received signal 375. In step 440, the received signal 375 is coupled (e.g., through the switch 352) to the demodulator 380 (e.g., or as the receive data 385 on an output of the receiver 350). In step 445, if there is no state change (step 445=No), then steps 430 through 440 are performed again. Typically, the first time step 430 is performed, the switch 353 will be changed to position B and the position of switch 353 will not change until a state change in step 445 (step 445=Yes). Similarly, the first time step 440 is performed, the switch 352 will be changed to position B and the position of switch 352 will not change until state change in step 445 (step 445=Yes). When there is a state change (step 445=Yes), the method continues in step 405.

Typically, steps 415 and 435 should perform the same conversion. However, there may be implementations when there are differences between how the amplified transmit RF signal 337 (e.g., as the reduced power RF transmit signal 340) is converted to the feedback signal 347 and how the amplified received RF signal 365 is converted to the received signal 375. These differences could be resolved by modifying the receiving subsystem circuitry 370 to perform certain operations in response to the switches 352 and 353 being in certain positions (e.g., or in response to the control signal 354) or could be performed by additional circuitry implemented, for example, intermediate the tap 336 and the A position of the switch 353. Although typically not the case, there may also be differences in the feedback signal 347 and the received signal 375. These latter differences may be could be resolved by modifying the receiving subsystem circuitry 370 to perform certain operations in response to the switches 352 and 353 being in certain positions (e.g., or in response to the control signal 354) or could be performed by additional circuitry implemented, for example, intermediate the receiving subsystem circuitry 370 and the adaptive predistortion algorithm circuitry 325.

It should also be noted, as stated above, that there may be no actual determination of the state of the transmitter 310 (step 405). Instead, steps 410-420 could be performed for a first predetermined time period then steps 430-440 would be performed for a second predetermined time period. In fact, there could be two conditions used to control method 400: during a first condition (e.g., a first state of the transmitter 310 or of the receiver 350, or a first time period for transmission), then receiving subsystem circuitry would be coupled to the amplified transmit RF signal (step 410); during a second condition (e.g., a second state of the transmitter 310 or of the receiver 350, or a second time period for reception), then receiving subsystem circuitry would be coupled to the amplified received RF signal (step 430). Additionally, there may be more than two states of the transmitter 405 (e.g., "Active-Transmitting"; "Active-Creating Initial Data for Transmitting"; and "Idle"). Also, adaptive power amplifier linearization need not be performed every time a transmission is performed and, instead, adaptive power amplifier linearization could be performed periodically in terms of transmissions (e.g., adaptive power amplifier linearization could be performed every third transmission).

The foregoing description has provided by way of exemplary and non-limiting examples a full and informative description of the best method and apparatus presently contemplated by the inventors for carrying out the invention.

However, various modifications and adaptations may become apparent to those skilled in the relevant arts in view of the foregoing description, when read in conjunction with the accompanying drawings and the appended claims. Nonetheless, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the present invention, and not in limitation thereof.

What is claimed is:

1. In a transceiver, a method for adaptive power amplifier linearization in time division duplex communication systems, comprising:
    in response to a first condition:
        using a feedback signal generated by receiving subsystem circuitry, to perform adaptive power amplifier linearization on a signal to be transmitted,
    where using the feedback signal comprises comparing the feedback signal to a modulated data signal and updating characteristics of an adaptive predistortion algorithm based on the comparison; and
    in response to a second condition:
    performing operations in order to determine receive data from a received radio frequency (RF) signal, the operations using at least the receiving subsystem circuitry.

2. The method of claim 1, wherein the first and second conditions are mutually exclusive.

3. The method of claim 1, wherein:
    in response to the first condition, decoupling the received RF signal from the receiving subsystem circuitry so that receive data cannot be determined from the received RF signal; and
    in response to the second condition, not performing adaptive power amplifier linearization.

4. The method of claim 1, wherein:
    the signal to be transmitted is received from a first input of the transceiver;
    performing adaptive power amplifier linearization on the signal to be transmitted results in an amplified transmit RF signal;
    in response to the first condition:
        coupling the amplified transmit RF signal to a receiving subsystem;
        converting, using the receiving subsystem circuitry, the amplified transmit RF signal to the feedback signal;
        coupling the feedback signal to adaptive power amplifier linearization circuitry, the adaptive power amplifier linearization circuitry performing the adaptive power amplifier linearization; and
        outputting the amplified transmit RF signal to a first output of the transceiver; and
    in response to the second condition:
        receiving the received RF signal from a second input of the transceiver;
        coupling the received RF signal to the receiving subsystem circuitry;
        converting, using the receiving subsystem circuitry, the received RF signal to a received signal suitable for use in determining the receive data; and
        coupling the received signal to a second output of the transceiver.

5. The method of claim 1, wherein the transceiver comprises:
    a transmission portion that performs the adaptive power amplifier linearization on the signal to be transmitted; and
    a reception portion that performs the operations in order to determine receive data from the received RF signal and that comprises the receiving subsystem circuitry.

6. The method of claim 5, wherein the first condition comprises the transmission portion being in a first state, and wherein the second condition comprises the transmission portion being in a second state.

7. The method of claim 5, wherein the first condition comprises the transmission portion transmitting data, and wherein the second condition comprises the transmission portion not transmitting data.

8. A method for adaptive power amplifier linearization in time division duplex communication systems, comprising:
    in response to a first condition:
        using a feedback signal generated by receiving subsystem circuitry, to perform adaptive power amplifier linearization on a signal to be transmitted;
    in response to a second condition:
        performing operations in order to determine receive data from a received radio frequency (RF) signal, the operations using at least the receiving subsystem circuitry,
    wherein the transceiver comprises a transmission portion that performs the adaptive power amplifier linearization on the signal to be transmitted;
    a reception portion that performs the operations in order to determine receive data from the received RF signal and that comprises the receiving subsystem circuitry;
    the method further comprising:
        determining a number of times the transmission portion has transmitted data since a predetermined point; and
        determining if the number of times the transmission portion has transmitted data is a predetermined number of times,
    wherein the first condition comprises the transmitter transmitting data for the predetermined number of times and the second condition comprises the transmitter not transmitting data.

9. The method of claim 5, wherein the first condition comprises the receiving portion being in a first state and wherein the second condition comprises the receiving portion being in a second state.

10. The method of claim 1, wherein the first condition comprises a first time period scheduled for performing adaptive power amplifier linearization, and wherein the second condition comprises a second time period scheduled for performing operations in order to determine receive data from the received RF signal.

11. The method of claim 10, wherein the method further comprises transmitting data, and wherein performing adaptive power amplifier linearization is performed when transmitting data.

12. A transceiver comprising:
    first and second inputs;
    first and second outputs;
    adaptive power amplifier linearization circuitry comprising first and second inputs and an output, the first input of the adaptive power amplifier linearization circuitry coupled to the first input of the transceiver, the output of the adaptive power amplifier linearization circuitry coupled to the first output of the transceiver;

a first switch comprising first and second input terminals and an output terminal, the first input terminal of the first switch coupled to the output of the adaptive power amplifier linearization circuitry, the second input terminal of the first switch coupled to the second input of the transceiver;

receiving subsystem circuitry having an input and an output, the input of the receiving subsystem circuitry coupled to the output terminal of the first switch; and a second switch comprising first and second output terminals and an input terminal, the input terminal of the second switch coupled to the output of the receiving subsystem circuitry, the first output terminal of the second switch coupled to the second input of the adaptive power amplifier predistortion algorithm circuitry, and the second output terminal of the second switch coupled to the second output of the transceiver.

13. The transceiver of claim 12, wherein:

the receiving subsystem circuitry is adapted to convert a signal provided by the output terminal of the first switch into a first signal suitable for coupling to the second input of the adaptive power amplifier linearization circuitry and for use in determining receive data; and the adaptive power amplifier linearization circuitry is adapted to distort, by using at least the first signal, a second signal from the first input and adapted to amplify the second signal, wherein the distortion and amplification create a third signal on the output of the adaptive power amplifier linearization circuitry and create an approximately linear relationship between the second and third signals.

14. The transceiver of claim 13, wherein the adaptive power amplifier linearization circuitry further comprises:

adaptive predistortion algorithm circuitry comprising two inputs and an output, the first input of the adaptive predistortion algorithm circuitry coupled to the first input of the adaptive power amplifier linearization circuitry, the second input of the adaptive predistortion algorithm circuitry coupled to the second input of the adaptive power amplifier linearization circuitry, the adaptive predistortion algorithm circuitry adapted to distort, by using at least the first signal, the second signal to create a fourth signal on the output of the adaptive predistortion algorithm circuitry; and a power amplifier comprising an input and an output, the input of the power amplifier coupled to the output of the adaptive predistortion algorithm circuitry, the output of the power amplifier coupled to the output of the adaptive power amplifier linearization circuitry, the power amplifier adapted to amplify the fourth signal and adapted to produce the third signal.

15. The transceiver of claim 12, wherein:

the first switch couples the first input terminal of the first switch to the output terminal of the first switch in a first position and couples the second input terminal of the first switch to the first output terminal of the first switch in a second position; and the second switch couples the input terminal of the second switch to the first output terminal of the second switch in the first position and couples the input terminal of the second switch to the second output terminal of the second switch in the second position.

16. The transceiver of claim 15, further comprising control circuitry coupled to the first and second switches, the control circuitry adapted to switch both the first and second switches between the first and second positions.

17. The transceiver of claim 16, wherein the control circuitry is further adapted to switch both the first and second switches into the first position for a first time period and to switch both the first and second switches into the second position for a second time period.

18. The transceiver of claim 16, wherein:

the control circuitry is further adapted to switch both the first and second switches from the second position to the first position based on a first state of transmission, and is further adapted to switch both the first and second switches from the first position to the second position based on a second state of transmission.

19. The transceiver of claim 16, wherein:

the first state of transmission corresponds to transmitting data; and the second state of transmission corresponds to receiving data and not transmitting data.

20. The transceiver of claim 12, further comprising:

a modulator intermediate and coupled to the first input and the input of the adaptive power amplifier linearization circuitry;

a low noise amplifier intermediate and coupled to the second input and the second input terminal of the first switch; and a demodulator intermediate and coupled to the second output terminal of the second switch and the second output.

* * * * *